US009362872B2

(12) United States Patent
Park et al.

(10) Patent No.: US 9,362,872 B2
(45) Date of Patent: *Jun. 7, 2016

(54) SELF-BIASING RADIO FREQUENCY CIRCUITRY (71) Applicant: Marvell World Trade Ltd., St. Michael (BB)

(72) Inventors: Jinho Park, San Jose, CA (US); Yuan Lu, Sunnyvale, CA (US); Li Lin, Saratoga, CA (US)

(73) Assignee: Marvell World Trade, Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 14/134,223

(22) Filed: Dec. 19, 2013

(65) Prior Publication Data

US 2014/0132349 A1 May 15, 2014

Related U.S. Application Data (63) Continuation of application No. 13/348,397, filed on Jan. 11, 2012, now Pat. No. 8,624,673.

(60) Provisional application No. 61/433,470, filed on Jan. 17, 2011.

(30) Foreign Application Priority Data

| Nov. 11, 2010 | (KR) | ......................... 10-2013-7021823 |
| Jan. 12, 2012 | (CN) | ........................... 2012 8 0005541 |
| Jan. 12, 2012 | (TW) | .............................. 101101224 A |
| Jan. 12, 2012 | (WO) | ...................... PCT/US12/21032 |

(51) Int. Cl.
*H03F 3/26* (2006.01)
*H03F 3/30* (2006.01)
(Continued)

(52) U.S. Cl.
CPC ............ *H03F 3/3016* (2013.01); *H03F 1/0272* (2013.01); *H03F 1/083* (2013.01);
(Continued)

(58) Field of Classification Search
CPC .................................. H03F 3/26; H03F 3/265
USPC .......................................... 330/267, 264, 265
See application file for complete search history.

(56) References Cited

U.S. PATENT DOCUMENTS

| 3,887,878 A * | 6/1975 | Schade, Jr. ............ H03F 3/3076 |
| | | 330/267 |
| 4,087,760 A | 5/1978 | Yokoyama |

(Continued)

FOREIGN PATENT DOCUMENTS

| TW | 201233053 | 8/2012 |
| WO | WO-2006013543 | 2/2006 |

OTHER PUBLICATIONS

"Non-Final Office Action", U.S. Appl. No. 13/348,397, Apr. 25, 2013, 11 pages.

(Continued)

*Primary Examiner* — Henry Choe (57) ABSTRACT

The present disclosure describes self-biasing radio frequency circuitry. In some aspects a radio frequency (RF) signal is amplified via a circuit having a first transistor configured to source current to an output of the circuit and a second transistor configured to sink current from the output of the circuit, and another signal is provided, without active circuitry, from the output of the circuit to a gate of the first transistor effective to bias a voltage at the output of the circuit. By so doing, the output of the circuit can be biased without active circuitry which can reduce design complexity of and substrate area consumed by the circuit.

20 Claims, 6 Drawing Sheets (51) Int. Cl.
*H03F 1/02* (2006.01)
*H03F 1/08* (2006.01)
*H03F 3/195* (2006.01)

(52) U.S. Cl.
CPC ............. *H03F 3/195* (2013.01); *H03F 3/3028* (2013.01); *H03F 2200/294* (2013.01); *H03F 2203/30021* (2013.01); *H03F 2203/30027* (2013.01); *H03F 2203/30031* (2013.01); *H03F 2203/30033* (2013.01); *H03F 2203/30036* (2013.01); *H03F 2203/30084* (2013.01); *H03F 2203/30117* (2013.01)

(56) References Cited

U.S. PATENT DOCUMENTS

| | | | |
|---|---|---|---|
| 5,900,783 A | 5/1999 | Dasgupta | |
| 6,097,253 A * | 8/2000 | Hissen | 330/277 |
| 6,714,043 B1 * | 3/2004 | Sharpe-Geisler | 326/39 |
| 6,870,391 B1 * | 3/2005 | Sharpe-Geisler | 326/37 |
| 7,936,217 B2 * | 5/2011 | Deng | H03F 1/0261 330/264 |
| 8,354,886 B2 * | 1/2013 | Brekelmans | H03F 1/308 330/267 |
| 8,624,673 B2 | 1/2014 | Park et al. | |
| 2003/0203743 A1 | 10/2003 | Sugar et al. | |
| 2007/0273442 A1 * | 11/2007 | Bajdechi et al. | 330/253 |
| 2009/0140812 A1 | 6/2009 | Deng et al. | |
| 2011/0133839 A1 * | 6/2011 | Brekelmans | 330/267 |
| 2012/0182072 A1 | 7/2012 | Park | |

OTHER PUBLICATIONS

"Notice of Allowance", U.S. Appl. No. 13/348,397, Sep. 3, 2013, 6 pages.

"PCT Search Report and Written Opinion", Application No. PCT/US2012/021032, Mar. 30, 2012, 14 pages.

Molnar, et al.,' "An Ultra-low Power 900 MHz RF Transceiver for Wireless Sensor Networks", In Proceedings of Custom Integrated Circuits Conference 2004, Oct. 3, 2004, 4 pages.

"Foreign Office Action", CN Application No. 201280005541.2, May 27, 2015, 20 Pages.

* cited by examiner

Fig. 1

```
┌─────────────────────────────────────┐
│ Wireless Interface              130 │
│ ┌─────────────────────────────────┐ │
│ │ MAC Controller              202 │ │
│ └─────────────────────────────────┘ │
│ ┌─────────────────────────────────┐ │
│ │ Baseband Processing Block   204 │ │
│ └─────────────────────────────────┘ │
│ ┌─────────────────────────────────┐ │
│ │ RF Block                    206 │ │
│ │ ┌─────────────────────────────┐ │ │
│ │ │ RF Mixer                208 │ │ │
│ │ └─────────────────────────────┘ │ │
│ │ ┌─────────────────────────────┐ │ │
│ │ │ Low-Noise Amplifier     210 │ │ │
│ │ │ ┌─────────────────────────┐ │ │ │
│ │ │ │ Push-Pull Circuitry 212 │ │ │ │
│ │ │ └─────────────────────────┘ │ │ │
│ │ └─────────────────────────────┘ │ │
│ │ ┌─────────────────────────────┐ │ │
│ │ │ Power Amplifier         214 │ │ │
│ │ └─────────────────────────────┘ │ │
│ │ ┌─────────────────────────────┐ │ │
│ │ │ Filter                  216 │ │ │
│ │ └─────────────────────────────┘ │ │
│ │ ┌─────────────────────────────┐ │ │
│ │ │ Antenna Port(s)         218 │ │ │
│ │ └─────────────────────────────┘ │ │
│ └─────────────────────────────────┘ │
└─────────────────────────────────────┘
```

SELF-BIASING RADIO FREQUENCY CIRCUITRY

RELATED APPLICATIONS

This application is a continuation of and claims priority to U.S. Pat. No. 8,624,673, filed Jan. 11, 2012 which in turn claims priority to U.S. Provisional Patent Application Ser. No. 61/433,470 filed Jan. 17, 2011, the disclosure of which are incorporated by reference herein in their entirety. This application is further related to PCT Application Serial No. PCT/US12/21032 filed Jan. 12, 2012, and national stage filings including Taiwanese Application Serial No. 101101224, Chinese Application Serial No. 201280005541.2, and Korean Application Serial No. 10-2013-7021823, all of which have a filing date of Jan. 12, 2012.

BACKGROUND

The background description provided herein is for the purpose of generally presenting the context of the disclosure. Unless otherwise indicated herein, the approaches described in this section are not prior art to the claims in this disclosure and are not admitted to be prior art by inclusion in this section.

Wireless communications between computing devices are often transmitted as radio frequency (RF) signals. Communications (e.g., data or medium control information) of a transmitting device are modulated to a radio frequency and amplified before being broadcast as RF signals via an antenna. These RF signals, often because they have a degraded signal strength due to antenna efficiencies or propagation, are typically amplified by a receiving device to enable demodulation of the RF signals and recovery of the communications. Circuitry associated with the amplification of RF signals, however, may have stability issues due to high-impedance nodes within the circuitry. While these stability issues can be resolved with negative feedback, circuitry capable of providing negative feedback is typically active circuitry (e.g., operational amplifiers). Adding active feedback circuitry to an amplifier circuit, however, increases design complexity and an amount of substrate area consumed by the amplifier circuit, which may result in increased design costs, fabrication costs, and/or amplifier power consumption.

SUMMARY

This summary is provided to introduce subject matter that is further described below in the Detailed Description and Drawings. Accordingly, this Summary should not be considered to describe essential features nor used to limit the scope of the claimed subject matter.

A method is described for amplifying a radio frequency (RF) signal via a circuit having a first transistor configured to source current from a power source to an output of the circuit based on the RF signal and a second transistor configured to sink current from the output of the circuit to a current sink based on the RF signal, and providing, without active circuitry, another signal from the output of the circuit to a gate of the first transistor effective to bias a voltage at the output of the circuit.

Another method is described for applying an RF signal to respective gates of a first and a second metal-oxide-semiconductor field-effect transistor (MOSFET) that are operatively connected in series between a power source and a current sink by their respective drains, sourcing current via the first MOSFET to an output formed at the drains, sinking current via the second MOSFET from the output formed at the drains, and biasing a voltage at the output without active circuitry operably connected between a gate of the first MOSFET and the output formed at the drains of the first and the second MOSFETs.

A circuit is described that includes two p-type metal-oxide-semiconductor field-effect transistors (pMOSFETs) operably connected in series and configured to source current from a current source to an output of the circuit, two n-type metal-oxide-semiconductor field-effect transistors (nMOSFETs) operably connected in series and configured to sink current from the output of the circuit to a current sink, and non-active biasing circuitry operably connected between the output of the circuit and a gate of one of the pMOSFETs configured to bias a voltage of the output of the circuit.

The details of one or more implementations are set forth in the accompanying drawings and the description below. Other features and advantages will be apparent from the description and drawings, and from the claims.

BRIEF DESCRIPTION OF THE DRAWINGS

The details of one or more implementations are set forth in the accompanying figures and the detailed description below. In the figures, the left-most digit of a reference number identifies the figure in which the reference number first appears. The use of the same reference numbers in different instances in the description and the figures indicate like elements.

DETAILED DESCRIPTION

Conventional amplification circuits use active circuitry to maintain stability when amplifying radio frequency (RF) signals. This active circuitry (e.g., transistors, diodes, operational amplifiers) increases design complexity and an amount of substrate area consumed by the amplification circuit. This disclosure describes apparatuses and techniques for self-biasing that enable an amplification circuit to be implemented without active feedback circuitry. A signal can be provided from the output of an amplification circuit to a gain cell of the amplification circuit in such a way as to preserve stability during operation, thereby precluding a need to add active circuitry to the amplification circuit.

The following discussion describes an operating environment, techniques that may be employed in the operating environment, and a System-on-Chip (SoC) in which components of the operating environment can be embodied. In the discussion below, reference is made to the operating environment by way of example only.

Operating Environment

Figure 1:
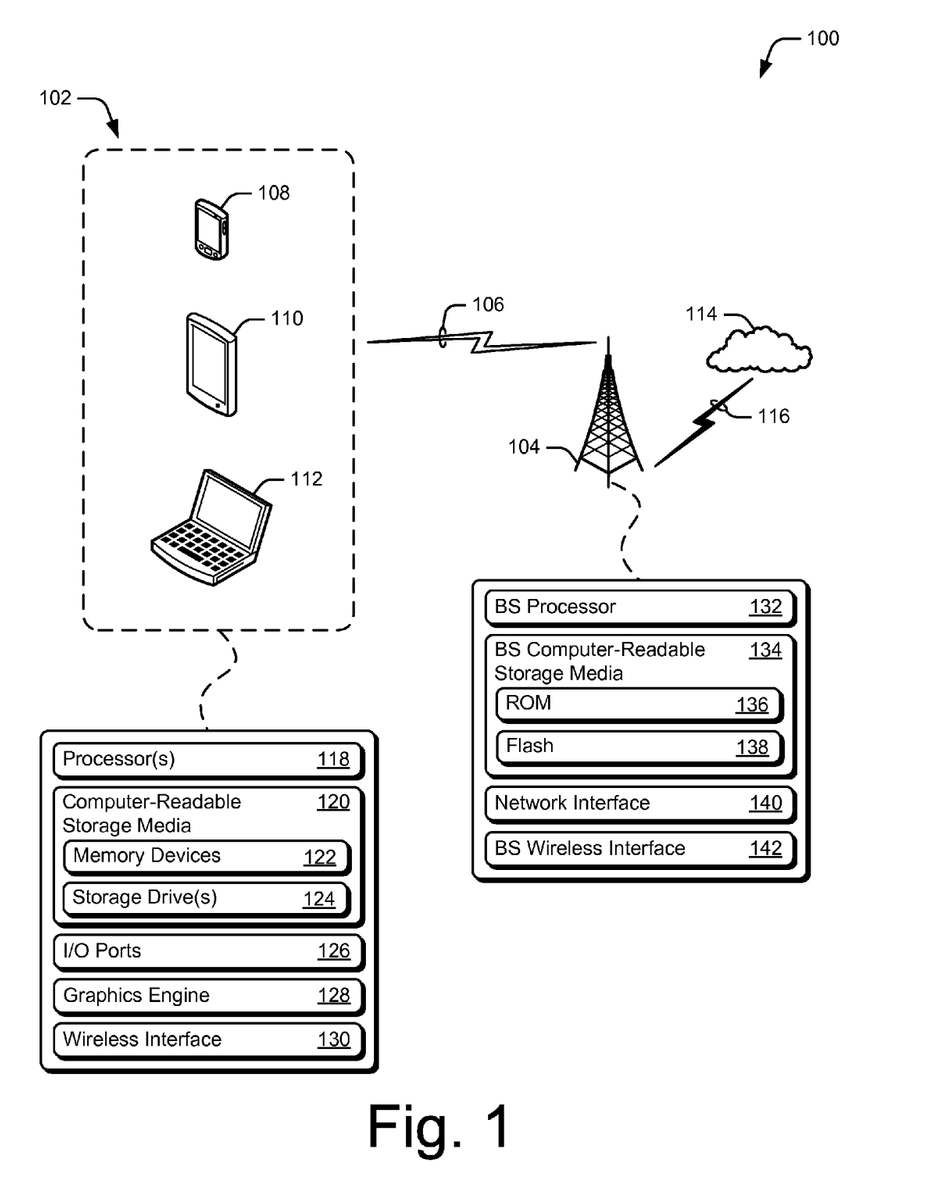
FIG. 1 illustrates an operating environment having wireless devices in accordance with one or more aspects.

FIG. 1 illustrates an example of an operating environment 100 having wireless computing devices 102 (wireless devices 102) and a base station 104, each of which are capable of communicating data, packets, and/or frames over a wireless connection 106, such as a cellular, local-area, or short-range wireless network. The wireless network may operate in accordance with various standards, such as high-speed packet access (HSPA) or long-term evolution (LTE) cellular standards, or an Institute of Electrical and Electronics Engineers (IEEE) standard such as 802.11, 802.15, or 802.16. Wireless computing devices 102 include smart-phone 108, tablet computer 110, and laptop computer 112. Although not shown, other configurations of wireless computing devices 102 are also contemplated, such as a desktop computer, a server, personal navigation device (PND), mobile-internet device (MID), network-attached-storage (NAS) drive, mobile gaming console, and so on.

Base station 104 provides connectivity to Internet 114 or other networks via backhaul link 116, which may be either wired or wireless (e.g., a T1 line, a fiber optic link, a wireless data relay). Although not shown, other configurations of base station 104 are also contemplated, such as an access point or cellular modem. Backhaul link 116 may include or connect with data networks operated by an internet service provider, such as a digital subscriber line (DSL) or broadband cable and may interface with base station 104 via an appropriately configured modem (not shown). While in communication with base station 104, smart-phone 108, tablet computer 110, or laptop computer 112 has internet access and/or connectivity with other networks and services for which base station 104 acts as a gateway.

Each of wireless devices 102 include processor(s) 118 and computer-readable storage media 120. Processor 118 can be any suitable type of processor, either single-core or multi-core, for executing instructions or code associated with applications and/or an operating system of the wireless device 102. Processor 118 may be constructed with or fabricated from any suitable material such as silicon or other semiconductors. Computer-readable storage media 120 may include any type and/or combination of suitable storage media, such as electronic, magnetic, or optical media embodied as memory devices 122 and storage drive(s) 124. Memory devices 122 may include memory components or modules such as random-access memory (RAM), non-volatile RAM (NVRAM), read-only memory (ROM), or Flash memory useful to store data of applications and/or an operating system of the wireless device 102 (not shown). Storage drive(s) 124 may include hard disk drives and/or solid-state drives (not shown) and are useful to store code or instructions associated with the applications and the operating system of wireless device 102.

Wireless devices 102 may also each include I/O ports 126, graphics engine 128, and wireless interface 130. I/O ports 126 allow a wireless device 102 to interact with other devices and/or users. Graphics engine 128 processes and renders graphics for wireless device 102, including user interface elements of an operating system, applications, and the like. Wireless interface 130 provides one or more wireless connections, such as wireless connection 106 with base station 104, and is described in greater detail below.

Base station 104 includes base station processor 132 (BS processor 132) and base station computer-readable storage media 134 (BS computer-readable storage media 134). BS computer-readable storage media 134 includes any suitable type and/or combination of storage media, such as electronic media embodied as ROM 136, Flash 138, or other memory devices (not shown). ROM 136 may store firmware (e.g., boot code) for base station 104 and Flash 138 may be useful to store code or instructions associated with an operating system of base station 104.

Base station 104 also includes network interface 140 and base station wireless interface 142 (BS wireless interface 142). Network interface 140 enables base station 104 to communicate via backhaul link 116 with the Internet or other networks. BS wireless 142 enables communication with wireless devices 102 or other wirelessly-enabled clients. BS wireless interface 142 may be similar in configuration to wireless interface 130, having the same circuits or components, while featuring increased power output and/or robust routing abilities for communication with a number of wireless clients over greater distances.

Figure 2:
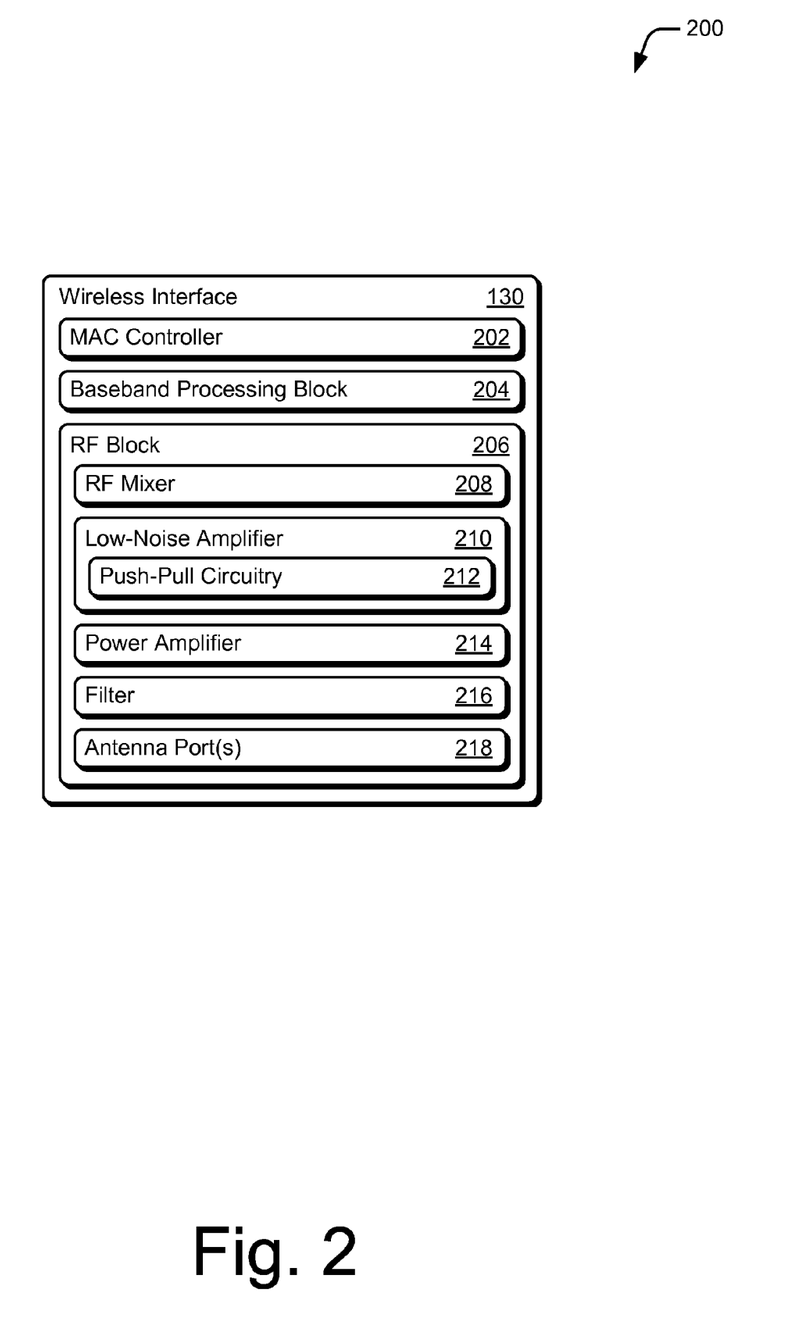
FIG. 2 illustrates a detailed aspect of an example of the wireless interface shown in FIG. 1.

FIG. 2 illustrates a detailed example of wireless interface 130, which is capable of communicating over various wireless networks, such as cellular, local-area, or short-range wireless networks. Wireless interface 130 includes medium access control (MAC) controller 202, which facilitates communication of data between wireless interface 130 and wireless device 102 via a suitable internal bus (not shown), such as a serial bus, universal serial bus (USB), peripheral component interconnect (PCI) express bus, and the like. Wireless interface 130 also includes baseband processing block 204 and radio frequency block 206 (RF block 206) for processing and communicating wireless data.

Baseband processing block 204 manages communication functions of wireless interface 130 and processes (e.g., encodes/decodes) un-modulated data communicated by wireless interface 130. RF Block 206 includes RF mixer 208 for modulating data for transmission or demodulating received data. RF block 206 also includes low-noise amplifier 210 that amplifies received RF signals with push-pull circuitry 212, which is described below in greater detail. Power amplifier 214 amplifies signals of wireless interface 130 prior to transmission to base station 104 or other wireless devices. Although not shown, power amplifier 214 may also implement push-pull circuitry 212 to amplify RF signals. RF Block 206 may also include filter 216 to isolate particular frequency bands of RF signals communicated by wireless interface 130 and antenna port(s) 218 that enable connections to one or more antennas configured for diversity or multiple-input multiple-output (MIMO) communication. Functionalities or portions of RF block 206 may be implemented separately as transmitter and receiver components (not shown) or combined as a transceiver (shown).

Figure 3:
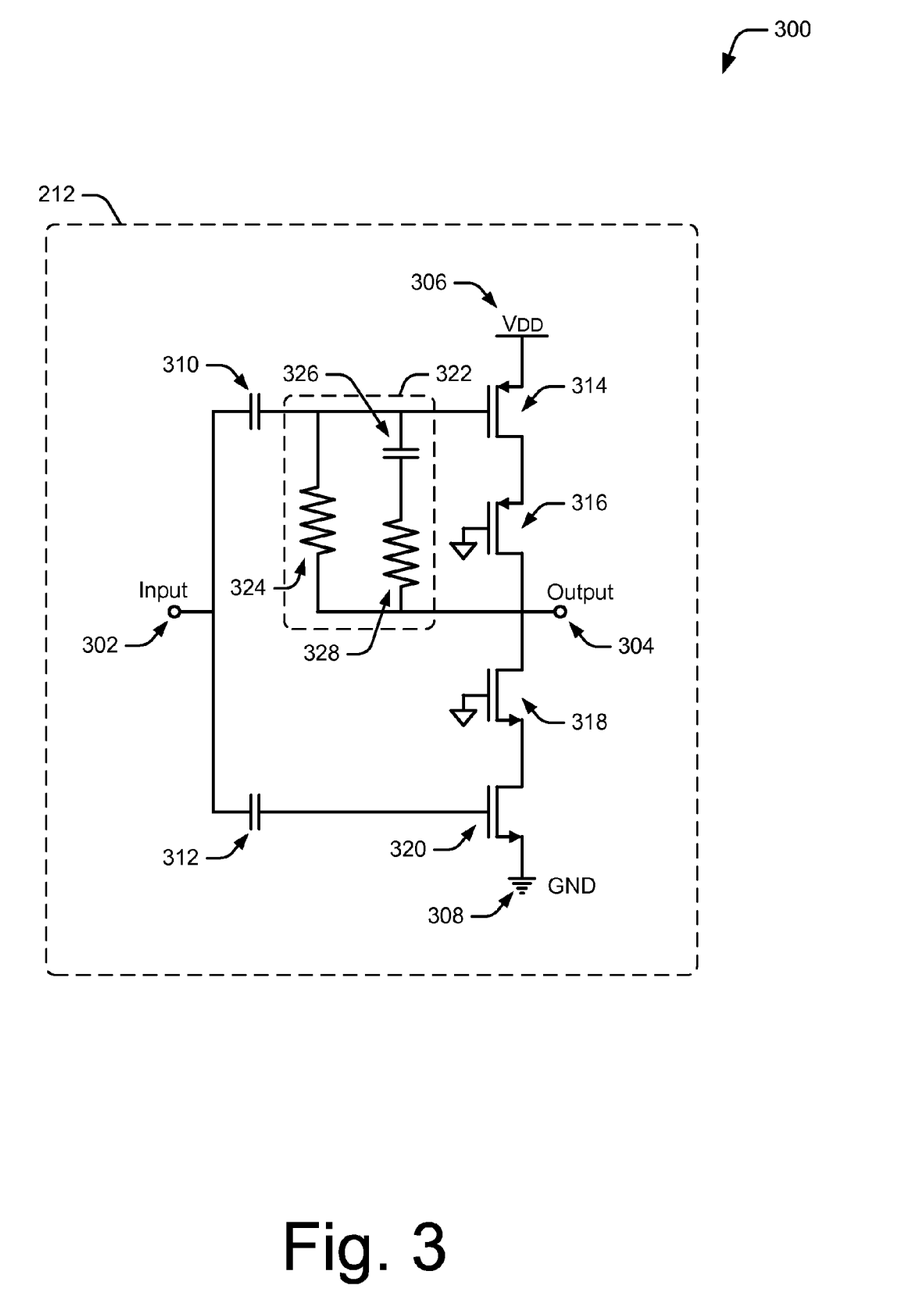
FIG. 3 illustrates a detailed aspect of an example of the push-pull circuitry shown in FIG. 2.

FIG. 3 illustrates a detailed example of push-pull circuitry 212, which is capable of amplifying RF signals for transmission or signal recover. Push-pull circuitry 212 includes input 302 at which a signal (e.g. RF signal) is received, and output 304 that provides an amplified signal (e.g. an amplified RF signal). Power can be supplied to push-pull circuitry 212 via voltage drain 306 ($V_{DD}$ 306) or another suitable power source. Current from push-pull circuitry 212 can be sank to ground 308 (GND 308) or another node having a potential lower than $V_{DD}$ 306.

Push-pull circuitry 212 may also include Direct Current (DC) blocking capacitors 310 and 312, which block DC or low frequency components of signals received at input 302. Transistors 314 and 316 are configured to source current from $V_{DD}$ 306 to output 304. Transistors 318 and 320 are configured to sink current from output 304 to GND 308. Transistors 316 and 318, functioning as additional gain cells, increase a gain of push-pull circuitry 212 or enable a similar gain at lower power supply potentials.

In this example, transistors 314 and 316 are illustrated as p-type metal-oxide-semiconductor field-effect transistors (pMOSFETs or pMOS) and transistors 318 and 320 are illustrated as n-type metal-oxide-semiconductor field-effect transistors (nMOSFETs or nMOS). Although shown as a single-ended or common-mode circuit, push-pull circuitry 212 may be implemented as a differential circuit by essentially mirroring the design shown. It should also be noted, that the push and pull sections of push-pull circuitry may be implemented with any suitable combination of transistors, such as with fewer transistors (e.g., without transistors 316 and 318) or with transistors of a different type or structure.

Push-pull circuitry 212 also includes self-biasing circuitry 322, which biases DC and/or low frequency voltages at output 304. Although current is sourced to and sank from output 304 at RF frequencies, biasing or setting a DC voltage at output 304 can enable proper circuit function. Self-biasing circuitry includes bias resistor 324, which provides a feedback signal from output 304 to a gate of transistor 314. By so doing, a DC voltage at output 304 can be biased or set based on bias resistor 324 and an amount of current flowing through transistor 314. Self-biasing circuitry 322 may also include compensation capacitor 326 for stability, such as when an impedance of input 302 and output 304 are similar. Depending on a value of compensation capacitor 326, self-biasing circuitry may include isolation resistor 328 to prevent compensation capacitor 326 from conducting RF signals.

As described above, wireless interface 130 and BS wireless interface 142 may be configured in a similar fashion, with BS wireless interface 142 having one or more of the components described above (e.g., push-pull circuitry 212). As such, apparatuses or techniques described herein may equally apply to a BS wireless interface 142. Additionally, although described with respect to a wireless networks, these techniques may be implemented in association with any wired or wireless communication system (e.g., microwave, optical) that implement push-pull amplification circuitry.

Techniques of Self-Biasing RF Circuitry

The following discussion describes techniques of self-biasing RF circuitry. These techniques can be implemented using the previously described environments, such as self-biasing circuitry 322 of FIG. 3 embodied on a wireless interface 130 of wireless device 102 and/or BS wireless interface 142 of base station 104. These techniques include methods illustrated in FIGS. 4 and 5, each of which is shown as a set of operations performed by one or more entities. These methods are not necessarily limited to the orders shown for performing the operations. Further, these methods may be used in conjunction with one another, in whole or in part, whether performed by the same entity, separate entities, or any combination thereof. In portions of the following discussion, reference will be made to operating environment 100 of FIG. 1 and entities of FIG. 2 and/or FIG. 3 by way of example. Such reference is not to be taken as limited to operating environment 100 but rather as illustrative of one of a variety of examples.

Figure 4:
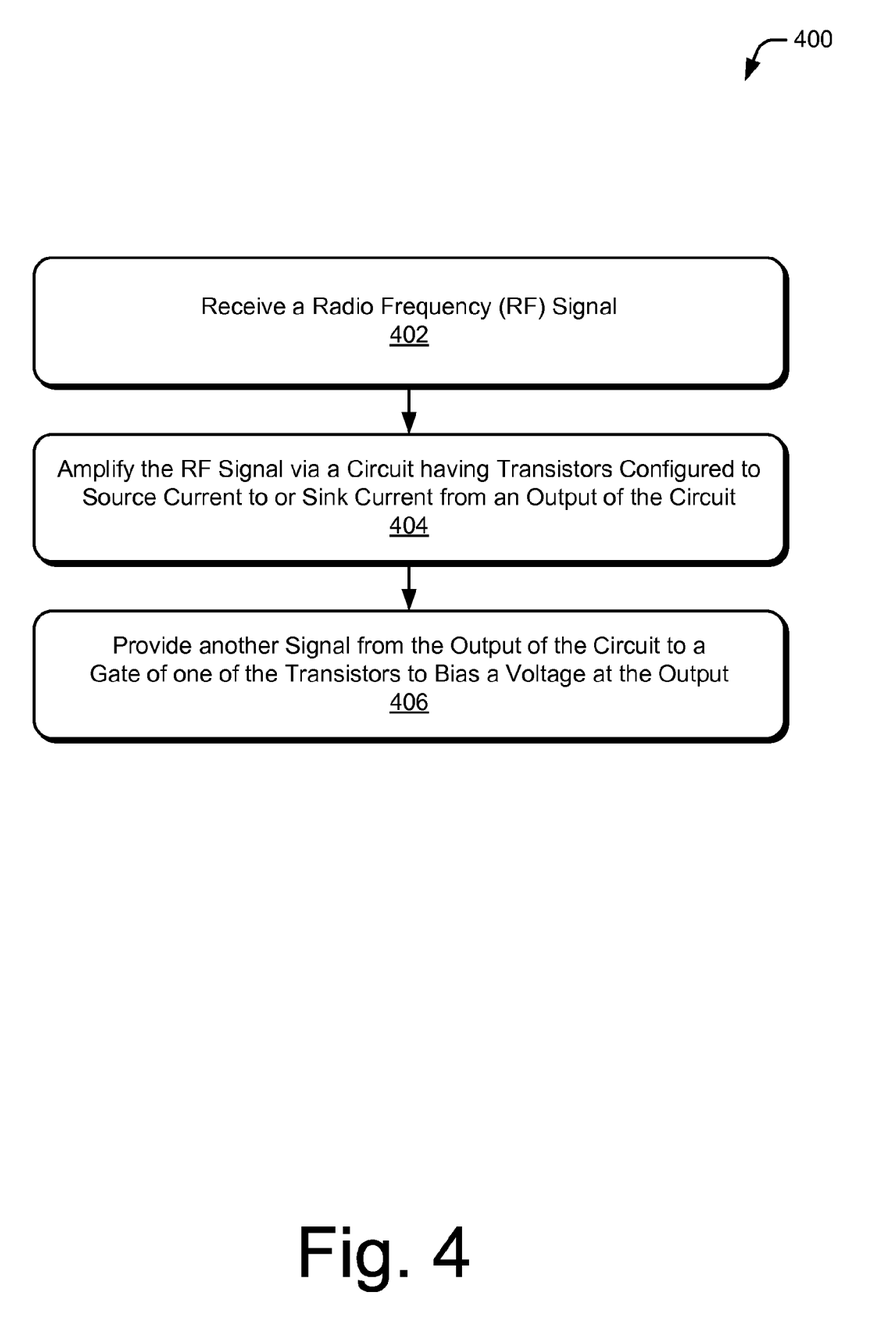
FIG. 4 illustrates a method of providing a signal from an output of a circuit to a gate of a transistor of the circuit.

FIG. 4 depicts a method 400 for self-biasing RF circuitry, including operations performed by self-biasing circuitry 322 of FIG. 3.

At 402, an RF signal is received. The RF signal may range in frequency from about 3 kHz to about 300 Ghz and may include encoded and/or modulated data. The RF signal may be received from any suitable source, such as a component in an RF circuit including a filter, switch, multiplexor, mixer, and the like. In some cases, the RF signal is a signal received via an antenna or an RF signal to be transmitted via an antenna.

As an example, consider smart-phone 108 in the context of FIG. 1, which shows smart-phone 108 communicating with base station 104 over wireless connection 106. Assume here that wireless interface 130 of smart-phone 108 is communicating over an LTE cellular network and is receiving RF signals from base station 104. Here, low-noise amplifier receives an RF signal from filter 216 for amplification.

At 404, the RF signal is amplified via a circuit having transistors configured to source current to or sink current from an output of the circuit. The circuit may be configured with a push-pull topology, such as push-pull circuitry 212 of FIGS. 2 and 3. The transistors of the circuit may be any suitable type of transistors, such as single or stacked pMOSFETs or nMOSFETs, configured to source or sink current respectively.

In the context of the present example, the RF signal is amplified by push-pull circuitry 212, which sources current from $V_{DD}$ 306 with transistors 314 and 316 to output 304 and sinks current from output 304 to GND 308 with transistors 318 and 320. This current sourced to and sank from output 304 forms an amplified RF signal at output 304 suitable for transmission to another stage of RF block 206, such as RF mixer 208.

At 406, another signal is provided from the output of the circuit to the gate of one of the transistors without active circuitry. This active circuitry may include any active circuit component or structure such as diodes, triodes, transistors, or operational amplifiers. The other signal may be provided via a resistor connected between the output of the circuit to the gate of one of the transistors. This other signal is effective to bias or set a voltage (DC or low frequency) at the output of the circuit.

Additionally, this signal may be compensated and/or isolated with additional passive circuitry, such as a capacitor and an additional resistor. In some cases, a compensation capacitor may be connected in parallel with the resistor conducting the other signal for compensation or stabilization purposes. In such a case, a resistor may be connected in series with this capacitor to prevent the capacitor from conducting or leaking an RF signal or noise.

Concluding the present example, a feedback signal is provided by bias resistor 324 or self-biasing circuitry 322. Assume here that impedances of input 302 and output 304 of push-pull circuitry 212 are similar and may cause stability issues. Compensation capacitor 326 provides compensation for these stability issues and isolation resistor 328 prevents compensation capacitor 326 from conducting an RF signal from output 304 to the gate of transistor 314. Note that this is but one example of self-biasing, and that a feedback signal may be provided using any suitable passive circuitry without departing from the spirit of the present disclosure.

Figure 5:
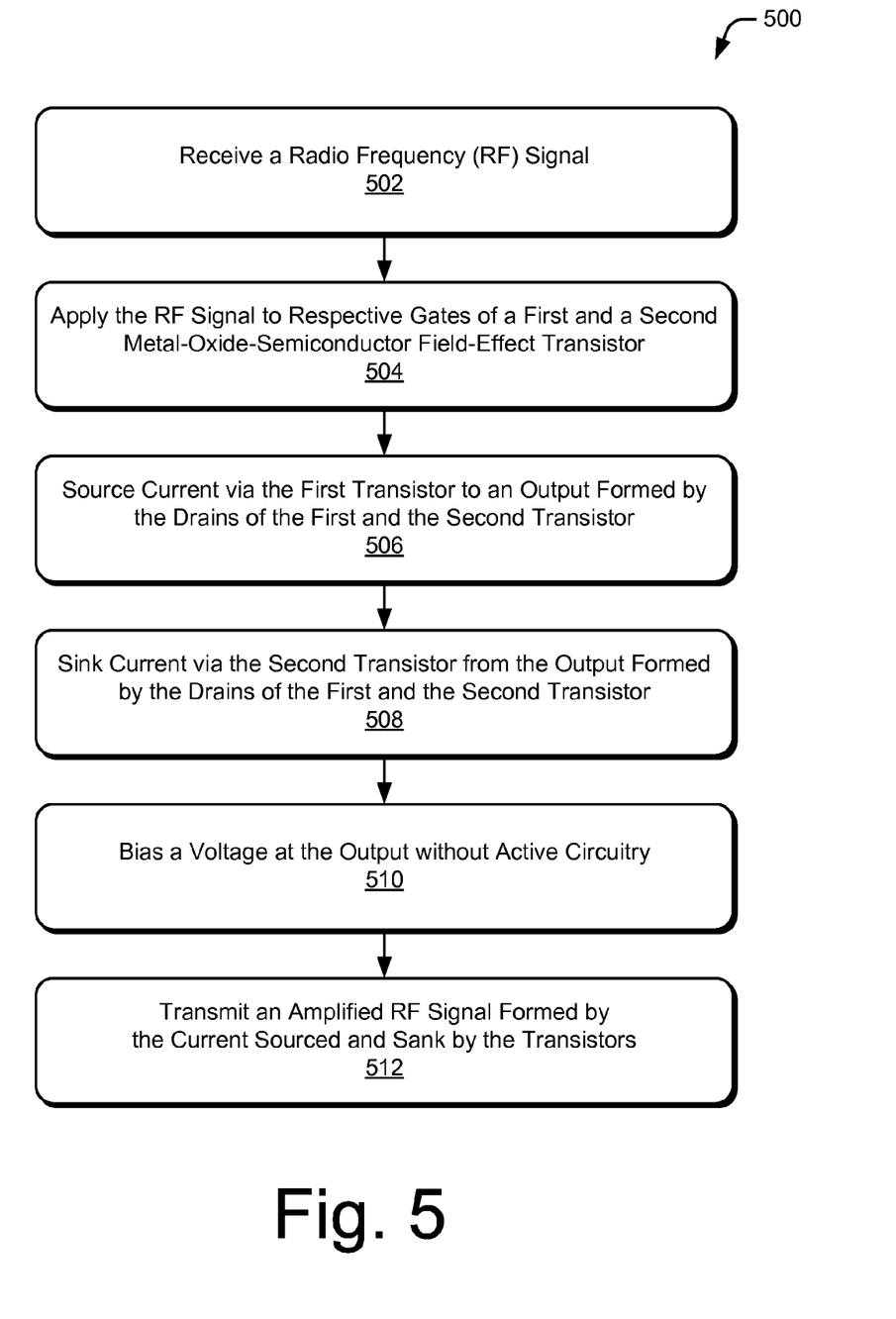
FIG. 5 illustrates a method of biasing a voltage of an output formed by gates of two transistors.

FIG. 5 depicts a method 500 of biasing a voltage of an output formed by gates of two transistors, including operations performed by self-biasing circuitry 322 of FIG. 3.

At 502, an RF signal is received. The RF signal may range in frequency from about 3 kHz to about 300 Ghz and may include encoded and/or modulated data. The RF signal may be received from any suitable source, such as a component in an RF circuit including a filter, switch, multiplexor, mixer, and the like. In some cases, the RF signal is a signal received via an antenna or an RF signal to be transmitted via an antenna.

As an example, consider RF block 206 of FIG. 2, which shows RF mixer 208, low-noise amplifier 210, power amplifier 214, filter 216, and antenna ports 218. Assume here that wireless interface 130 is receiving an RF signal from BS wireless interface 142 via wireless connection 106. Here antenna ports 218 receive the signal from antennas (not shown) and filter 216 mitigates signals of various undesirable frequency bands.

At 504, the RF signal is applied to respective gates of a first and a second metal-oxide-semiconductor field-effect transistor (MOSFET). The respective MOSFETs may be configured as single or stacked gain cells (cascode configurations), such as p-type MOSFETs and n-type MOSFETs connected by their respective gates (e.g., push-pull topology). Configuring MOSFETs as stacked gain cells can increase an effective gain of the gain cells or enable a similar gain to be obtained from the gain cells with reduced power consumption. In the context of the present example, the RF signal from filter 216 is applied to gates of transistors 314 and 320 of push-pull circuitry 212.

At 506, current is sourced via the first transistor to an output formed by the drains of the first and the second transistor. The current may be sourced from a higher potential node, such as a power supply or rail to which the first transistor is connected. An amount and/or frequency of the current sourced to the output may be based on the RF signal applied to the gates of the first transistor.

At 508, current is sank via the second transistor from the output formed by the drains of the first and the second transistor. The current may be sank from the output to a node of lower potential, such as a power or digital ground to which the second transistor is connected. An amount and/or frequency of the current sank from the output may be based on the RF signal applied to the gates of the second transistor.

In the context of the ongoing example and with reference to operations 506 and 508, transistors 314 and 316 source current from $V_{DD}$ 306 to output 304, which is formed by the drains of transistors 316 and 318. Transistors 318 and 320 sink to GND 308 from output 304, which is formed by the drains of transistors 316 and 318. The current sourced to or sank from output 304 forms an amplified RF signal based on the RF signal applied to the gates of transistors 314 and 320.

At 510, a voltage at the output formed by drains of the transistors is biased without active circuitry. The voltage may be a DC or low frequency voltage at the output. Biasing the voltage may implement a passive component, such as a resistor connected between the output formed by the drains of the transistors and a gate of the first transistor. Additionally, the output may be stabilized with additional passive components, such as a capacitor connected in parallel with the resistor. In such a case, another resistor may be connected in series with the capacitor to prevent the capacitor from conducting other RF signals or noise from the output to the gate of the first transistor.

Continuing the ongoing example, a DC voltage at output 304 is biased with bias resistor 324, which provides a feedback signal to a gate of transistor 314. Assume here that impedances of input 302 and output 304 of push-pull circuitry 212 are similar and may cause stability issues. Compensation capacitor 326 provides compensation for these stability issues and has a capacitance value that sufficiently prevents other RF signals or noise from conducting from output 304 to the gate of transistor 314. Thus, in this case, an additional isolation resistor is not needed for stability or operation of push-pull circuitry 212. Note that this is but one example of self-biasing, and that a feedback signal may be provided using any suitable passive circuitry without departing from the spirit or intent of the present disclosure.

At 512, an amplified RF signal formed by the current sourced and sank by the transistors is transmitted. The amplified signal may be transmitted to any suitable component, such as an RF mixer, filter, switch, multiplexor, and the like. In some cases, the amplified RF signal may be transmitted to another amplification stage for further amplification.

Concluding the present example, low-noise amplifier 210 transmits an amplified signal of push-pull circuitry 212 to RF mixer 208 for further processing, such as demodulation. It should be noted that by implementing self-biasing circuitry, design of push-pull circuitry can be simplified which may result in design cost savings and a reduced amount of substrate consumed by the push-pull circuit.

System-on-Chip

Figure 6:
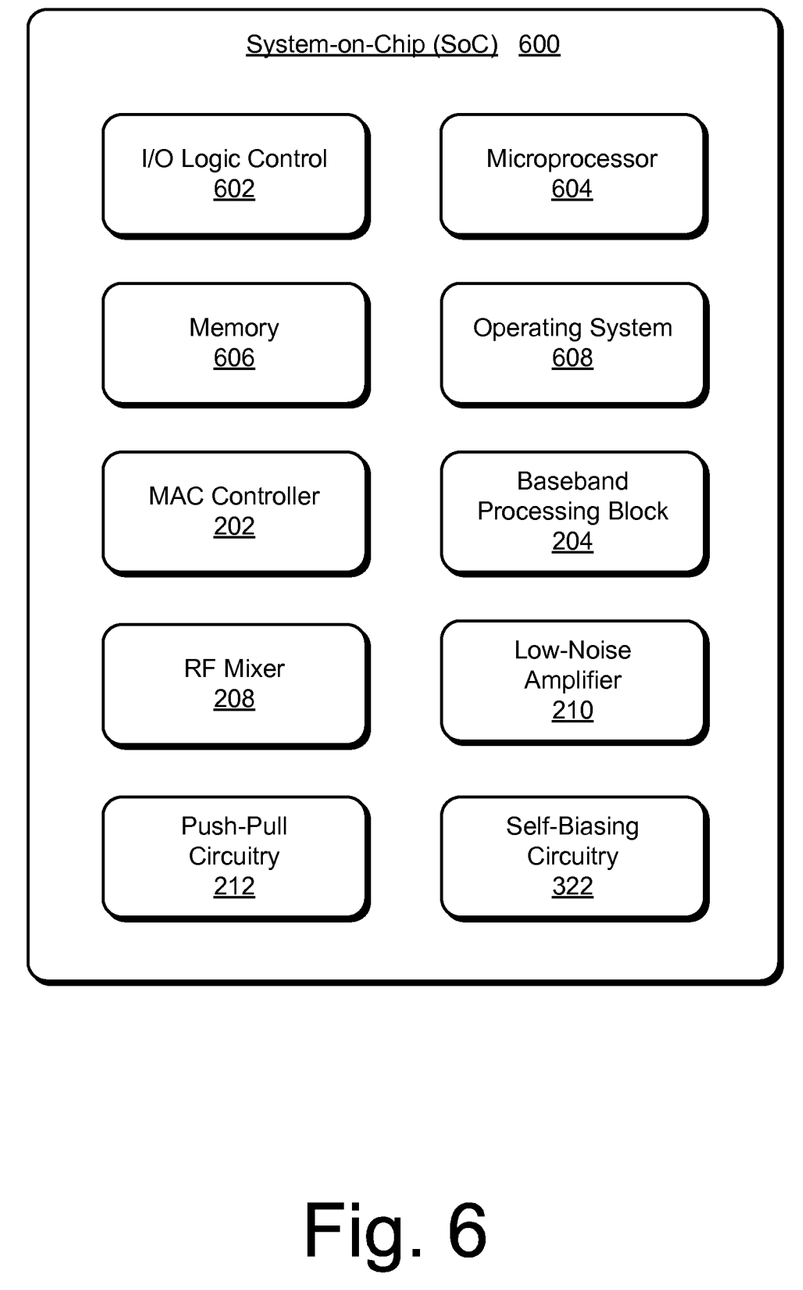
FIG. 6 illustrates a System-on-Chip (SoC) environment for implementing aspects of the techniques described herein.

FIG. 6 illustrates a System-on-Chip (SoC) 600, which can implement various embodiments described above. An SoC can be implemented in any suitable device, such as a smart-phone, cellular phone, video game console, IP enabled television, desktop computer, laptop computer, tablet computer, server, base station, wireless router, network-enabled printer, set-top box, printer, scanner, camera, picture frame, and/or any other type of device that may implement wireless connective technology.

SoC 600 can be integrated with electronic circuitry, a microprocessor, memory, input-output (I/O) logic control, communication interfaces and components, other hardware, firmware, and/or software needed to provide communicative coupling for a device, such as any of the above-listed devices or as an application specific integrated circuit (ASIC) for integration within any of the above-listed devices. SoC 600 can also include an integrated data bus (not shown) that couples the various components of the SoC for data communication between the components. A wireless communication device that includes SoC 600 can also be implemented with many combinations of differing components. In some cases, these differing components may be configured to implement concepts described herein over a wireless connection or interface.

In this example, SoC 600 includes various components such as an input-output (I/O) logic control 602 (e.g., to include electronic circuitry) and a microprocessor 604 (e.g., any of a microcontroller, application processor, or digital signal processor). SoC 600 also includes a memory 606, which can be any type of RAM, low-latency nonvolatile memory (e.g., flash memory), ROM, and/or other suitable electronic data storage. SoC 600 can also include various firmware and/or software, such as an operating system 608, which can be computer-executable instructions maintained by memory 606 and executed by microprocessor 604. SoC 600 can also include other various communication interfaces and components, communication components, other hardware, firmware, and/or software.

SoC 600 includes MAC Controller 202, baseband processing block 204, RF mixer 208, low-noise amplifier 210, push-pull circuitry 212, and self-biasing circuitry 322, which may be embodied as disparate or combined components, as described in relation to various aspects presented herein. Examples of these various components, functions, and/or entities, and their corresponding functionality, are described with reference to the respective components of the environment 100 shown in FIGS. 1-3.

Self-biasing circuitry 322, either independently or in combination with other entities, can be implemented with any suitable combination of passive components to implement various embodiments and/or features described herein. Self-biasing circuitry 322 may also be provided integral with other entities of the SoC, such as integrated with one or both of low-noise amplifier 210, push-pull circuitry 212, or any RF section within SoC 600. Alternately or additionally, self-biasing circuitry 322 and the other components can be implemented as hardware, firmware, fixed logic circuitry, or any combination thereof that is implemented in connection with the I/O logic control 602 and/or other signal processing and control circuits of SoC 600.

Although the subject matter has been described in language specific to structural features and/or methodological operations, it is to be understood that the subject matter defined in the appended claims is not necessarily limited to the specific features or operations described above, including orders in which they are performed.

What is claimed is:

1. A circuit comprising:
   a first transistor connected between a power rail and an output of the circuit, the first transistor configured to source, based on a radio frequency signal received at an input of the circuit, current from the power rail to the output of the circuit;
   a second transistor connected between the output of the circuit and a node having a potential lower than that of the power rail, the second transistor configured to sink, based on the radio frequency signal received at the input of the circuit, current from the output of the circuit to the node having the lower potential;
   non-active biasing circuitry operably connected between the output of the circuit and a gate of the first transistor or a gate of the second transistor, the non-active biasing circuitry comprising a first resistor and being effective to bias a voltage of the output of the circuit; and
   non-active compensating circuitry operably connected in parallel with the non-active biasing circuitry, the non-active compensating circuitry comprising a capacitor and second resistor connected in series and being effective to compensate the output of the circuit.

2. The circuit of claim 1, wherein the first transistor is a p-type metal-oxide-semiconductor field-effect transistor (pMOSFET) and the second transistor is an n-type metal-oxide-semiconductor field-effect transistor (nMOSFET).

3. The circuit of claim 1, further comprising:
   a third transistor connected in series with the first transistor and configured to source current to the output of the circuit; and
   a fourth transistor connected in series with the second transistor and configured to sink current from the output of the circuit effective to increase a gain or an efficiency of the circuit.

4. The circuit of claim 1, wherein the circuit is implemented as a common-mode amplifier, differential amplifier, or low-noise amplifier.

5. A method comprising:
   amplifying a radio frequency signal via a circuit having a first transistor and a second transistor, the first transistor connected between a power rail and an output of the circuit, the first transistor configured to source current from the power rail to the output of the circuit based on the radio frequency signal, the second transistor connected between the output of the circuit and a node having a potential lower than that of the power rail, the second transistor configured to sink current from the output of the circuit to the node having the lower potential based on the radio frequency signal;
   providing, via a first resistor connected between the output of the circuit and the gate of the first transistor or the gate of the second transistor, a bias signal from the output of the circuit to the gate of the first transistor or the gate of the second transistor effective to bias a voltage at the output of the circuit;
   compensating the bias signal via a capacitor connected in parallel with the first resistor; and
   preventing, via a second resistor connected in series with the capacitor, the capacitor from conducting radio frequency energy from the output of the circuit to the gate of the first transistor or the gate of the second transistor.

6. The method of claim 5, wherein the first transistor comprises a p-type metal-oxide-semiconductor field-effect transistor (pMOSFET) and the second transistor comprises an n-type metal-oxide-semiconductor field-effect transistor (nMOSFET).

7. The method of claim 5, wherein the circuit includes:
   a third transistor connected in series with the first transistor and configured to source current to the output of the circuit;
   a fourth transistor connected in series with the second transistor and configured to sink current from the output of the circuit; and wherein
   amplifying the radio frequency signal comprises sourcing current via the first and third transistors or sinking current via the second and fourth transistors effective to increase a gain or an efficiency of the circuit.

8. The method of claim 5, wherein the circuit that includes the first and second transistors is configured as a common-mode amplifier, a differential amplifier, or a low-noise amplifier.

9. An amplifier comprising:
   an input configured to receive a radio frequency signal;
   an output configured to transmit an amplified radio frequency signal;
   a first transistor configured to provide the amplified radio frequency signal by sourcing, based on the radio frequency signal, current from a power rail to the output of the amplifier;
   a second transistor configured to provide the amplified radio frequency signal by sinking, based on the radio frequency signal, current from the output of the amplifier to a node having a lower potential than that of the power rail;
   a first resistor connected between the output of the amplifier and a gate of the first transistor or a gate of the second transistor to provide a bias signal from the output of the amplifier to the gate of the first transistor or the gate of the second transistor effective to bias a voltage of the amplified radio frequency signal; and
   a capacitor and a second resistor connected in parallel with the first resistor to compensate the amplified radio frequency signal, the capacitor and second resistor connected in series.

10. The amplifier of claim 9, wherein the first transistor is a p-type metal-oxide-semiconductor field-effect transistor (pMOSFET) and the second transistor is an n-type metal-oxide-semiconductor field-effect transistor (nMOSFET).

11. The amplifier of claim 9, wherein the amplifier is embodied as part of a wireless communication interface.

12. The amplifier of claim 9, wherein the amplifier is embodied as a radio frequency low-noise amplifier or a radio frequency power amplifier.

13. The amplifier of claim 9, further comprising another capacitor connected between the input of the amplifier and: the gate of the first transistor; or the gate of the second transistor, the other capacitor to block direct current (DC) signals or low frequency signals.

14. The amplifier of claim 9, further comprising:
   a third transistor connected in series with the first transistor and configured to source current to the output of the amplifier; and
   a fourth transistor connected in series with the second transistor and configured to sink current from the output of the amplifier effective to increase a gain or an efficiency of the amplifier.

15. The circuit of claim 1, wherein the circuit further comprises another capacitor connected between the input of the circuit and: the gate of the first transistor; or the gate of the second transistor, the other capacitor to block direct current (DC) signals or low frequency signals.

16. The circuit of claim 1, wherein the output of the circuit comprises the drains of the first and second transistors.

17. The circuit of claim 1, wherein the voltage biased at the output of the circuit is a direct current (DC) voltage.

18. The method of claim 5, further comprising receiving the radio frequency signal from a filter, multiplexor, or switch operably coupled with an antenna.

19. The method of claim 5, further comprising transmitting, to a radio frequency mixer, an amplified RF signal formed by the current sourced and the current sank at the output of the circuit.

20. The method of claim 5, wherein a frequency of the radio frequency signal is within a range of three kilohertz to 300 gigahertz.

\* \* \* \* \*